United States Patent
Loibl et al.

(10) Patent No.: US 9,633,733 B2
(45) Date of Patent: *Apr. 25, 2017

(54) METHOD, APPARATUS AND DEVICE FOR DATA PROCESSING FOR DETERMINING A PREDETERMINED STATE OF A MEMORY

(71) Applicant: Infineon Technologies AG, Neubiberg (DE)

(72) Inventors: Ulrich Loibl, Munich (DE); Thomas Kern, Munich (DE)

(73) Assignee: Infineon Technologies AG, Neubiberg (DE)

( * ) Notice: Subject to any disclaimer, the term of this patent is extended or adjusted under 35 U.S.C. 154(b) by 85 days.

This patent is subject to a terminal disclaimer.

(21) Appl. No.: 14/190,804

(22) Filed: Feb. 26, 2014

(65) Prior Publication Data

US 2015/0243360 A1  Aug. 27, 2015

(51) Int. Cl.
| | | |
|---|---|---|
| G11C 16/10 | (2006.01) | |
| G11C 11/16 | (2006.01) | |
| G11C 11/22 | (2006.01) | |
| G11C 13/00 | (2006.01) | |
| G11C 14/00 | (2006.01) | |
| G11C 16/32 | (2006.01) | |
| G11C 7/08 | (2006.01) | |
| G11C 16/26 | (2006.01) | |
| G11C 17/18 | (2006.01) | |

(52) U.S. Cl.
CPC ........... *G11C 16/107* (2013.01); *G11C 7/08* (2013.01); *G11C 11/1673* (2013.01); *G11C 11/2293* (2013.01); *G11C 13/0061* (2013.01); *G11C 14/009* (2013.01); *G11C 16/32* (2013.01); *G11C 11/16* (2013.01); *G11C 13/0002* (2013.01); *G11C 13/004* (2013.01); *G11C 16/26* (2013.01); *G11C 17/18* (2013.01)

(58) Field of Classification Search
None
See application file for complete search history.

(56) References Cited

U.S. PATENT DOCUMENTS

| | | | | |
|---|---|---|---|---|
| 7,638,999 | B2 * | 12/2009 | Kojovic | ............... H02H 1/0007 |
| | | | | 324/127 |
| 7,902,813 | B2 * | 3/2011 | Kojovic | ............... H02H 1/0007 |
| | | | | 324/127 |
| 8,223,517 | B2 * | 7/2012 | Kishida | .................. H02M 1/12 |
| | | | | 363/125 |
| 9,196,320 | B2 * | 11/2015 | Kern | ........................ G11C 7/00 |
| 2006/0203566 | A1 | 9/2006 | Deml | |
| 2007/0236208 | A1 * | 10/2007 | Kojovic | ............... H02H 1/0007 |
| | | | | 324/127 |

(Continued)

OTHER PUBLICATIONS

U.S. Appl. No. 14/190,435, filed Feb. 26, 2014. 18 Pages.

(Continued)

*Primary Examiner* — Christopher D Birkhimer

(74) *Attorney, Agent, or Firm* — Eschweiler & Potashnik, LLC

(57) ABSTRACT

A method for data processing is suggested including: (i) transforming electrical variables for each cell of a data bit of a memory into a time domain; and (ii) determining a predetermined state by comparing the transformed electrical variables of at least two data bits.

22 Claims, 6 Drawing Sheets

(56) References Cited

U.S. PATENT DOCUMENTS

| | | | |
|---|---|---|---|
| 2008/0320427 A1* | 12/2008 | Nakashima | G06F 17/5036 716/113 |
| 2009/0116268 A1* | 5/2009 | Kishida | H02M 1/12 363/68 |
| 2010/0020457 A1* | 1/2010 | Kojovic | H02H 1/0007 361/93.2 |
| 2010/0232243 A1 | 9/2010 | Kobatake | |
| 2015/0170717 A1* | 6/2015 | Kern | G11C 7/00 365/190 |

OTHER PUBLICATIONS

Non Final Office Action Dated Oct. 23, 2015 U.S. Appl. No. 14/190,435.
Non Final Office Action Dated Jul. 11, 2016 U.S. Appl. No. 14/190,435.
Final Office Action Dated Mar. 31, 2016 U.S. Appl. No. 14/190,435.
Non Final Office Action Dated Mar. 7, 2017 U.S. Appl. No. 14/190,436.

* cited by examiner

Fig.1
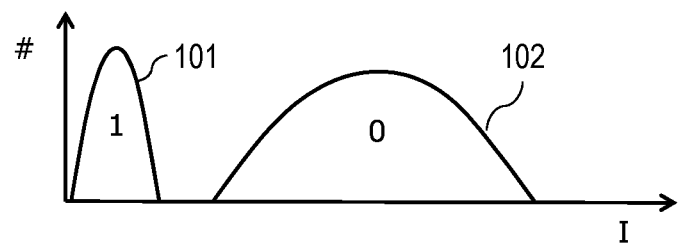
t= C*U/I
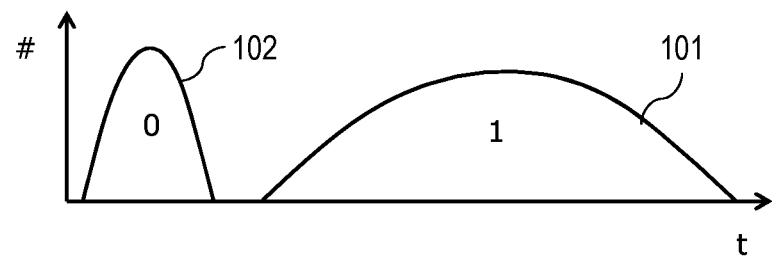

METHOD, APPARATUS AND DEVICE FOR DATA PROCESSING FOR DETERMINING A PREDETERMINED STATE OF A MEMORY

BACKGROUND

Embodiments of the present disclosure relate to a blank detection of data bits (with at least two cells per data bit) of a memory with differential read.

SUMMARY

A first embodiment relates to a method for data processing, comprising transforming electrical variables for each cell of a data bit of a memory into a time domain, and determining a predetermined state by comparing the transformed electrical variables of at least two data bits.

A second embodiment relates to a device, comprising a differential read memory, wherein each data bit is represented by a group of at least two memory cells, and wherein the at least two memory cells of this group are a true cell and a complementary cell. The device further comprises a conversion stage configured to transform electrical variables for each cell of a data bit into a time domain, and a processing unit configured to determine a predetermined state by comparing the transformed electrical variables of at least two data bits.

A third embodiment relates to a device for data processing, for determining a predetermined state of at least one data bit. The device comprises means for transforming electrical variables for each cell of a data bit of a memory into a time domain, and means for determining the predetermined state by comparing the transformed electrical variables of at least two data bits.

A fourth embodiment is directed to a computer program product directly loadable into a memory of a digital processing device, comprising software code portions for performing the method described herein.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

FIG. 1 shows an example diagram to visualize such transformation of a current distribution into a time domain distribution;

DETAILED DESCRIPTION

Figure 2:
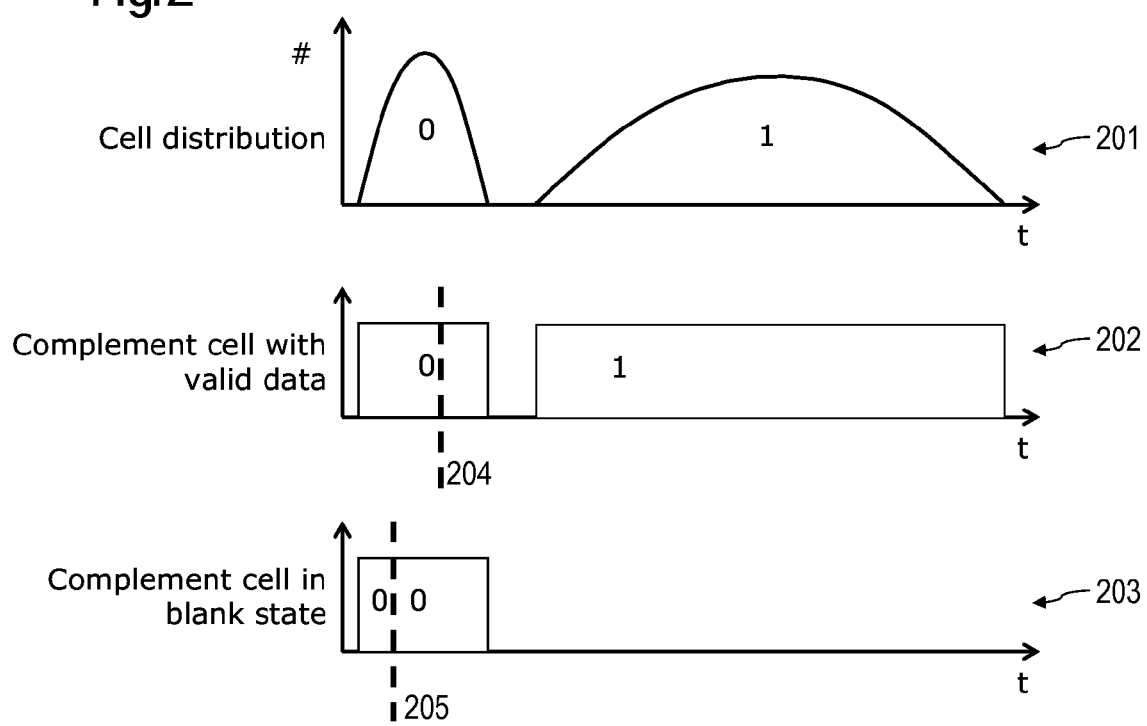
FIG. 2 shows an example of time-domain sensing of a complement cell comprising one true cell and one complementary cell.

The examples are directed to blank state detection, which is one exemplary state that could be subject to detection. However, other predetermined states may detected accordingly based on the concept described herein.

The introduction of a differential read in a non-volatile memory (NVM) improves reliability, e.g., even after a high number of write/erase cycles, but requires (at least) two NVM cells (also referred to as a cell pair) per data bit. The data bit may thus be represented by a complement cell, wherein the complement cell comprises at least one true cell and at least one complementary cell. In particular, the complement cell may comprise an equal number of true and complementary cells.

For example, a logical "0" of a complement cell (representing the data bit) can be associated with a physical "0" of the true cell and a physical "1" of the complementary cell. A logical "1" of the complement cell can be associated with a physical "1" of the true cell and a physical "0" of the complementary cell.

It is noted that a physical "0" can be regarded as a physical property assigned to a state "0". Accordingly, a physical "1" can be regarded as a physical property assigned to a state "1".

Hence, two associated NVM cells of a memory may store complementary information, i.e., they have opposite states. Only a bit that has complementary cell states can be successfully decoded, i.e., one of the two cells of a cell pair has to be in the written state and the other cell has to be in the erased state to allow for successful data decoding.

However, erasing of a memory portion, e.g., sector or page, comprising several data bits, each represented by two memory cells results in a state with both cells being in the erased state, a so-called "blank state" of the memory portion. Hence, after an erase operation, the data bits for the cell pair are not yet defined. Reading a cell pair may result in an unpredictable result or it may even provide varying results for repeated read operations.

Therefore, in case a software reads a blank state, the result of such read operation is unpredictable. Hence, additional measures may be required for the software to determine whether or not the pair of cells is in such blank state. The blank state may refer to an erased or to a not yet programmed memory area.

The solution presented in particular solves the problem of how to detect the reading of a blank state, without adding time for blank detection (e.g., due to a separate read operation) and without losing the advantages of differential read and preventing significant area increase and complicated operations (current or voltage comparators) in the analog domain.

One embodiment refers to a reading operation (also referred to as "sensing") of two cells per bit architectures, e.g., array architectures or array structures, wherein the two cells are differential cells, i.e., one cell is regarded as a true cell and the other cell is regarded as a complementary cell.

Another embodiment may refer to scenarios with more than two cells per bit architectures. For example, two (or more) true cells and two (or more) complementary cells may be used to represent a single data bit. Hereinafter, the examples directed to a complement cell with a cell pair is not limiting for the current approach as there may as well be several true and several complementary cells used for each complement cell.

In a reading (sensing) mode the two cells may be compared with each other and the sign of the current difference may be encoded in one digital state "1" or "0". When the actual read operation is conducted, the content of the memory portion may be checked whether it contains valid data (i.e., complement data) or the cells are blank.

The physical differences between the cells of a complement cell (i.e., the true cell and the complementary cell) may be based on a variation of a voltage, a resistance, a current and/or a variation of a signal over time. Due to cycling, aging or temperature effects, the physical differences may lead to additional shifts which may impede the detection of the complement data.

An advantage of the solution presented herein is that it may cope with a digital analysis at a high reliability.

An example of the solution presented herein may utilize detection of data stored in a complement cell based on a transformation into the time domain. FIG. 1 shows an example diagram to visualize such transformation of a current distribution into a time domain distribution. The transformation can be realized by integrating the current I via a capacitor C up to a trip point of a voltage U. The symbol "#" in FIG. 1 indicates a number of occurrences, leading to a cell distribution of cells showing a value "1" and cells showing a value "0". According to the example shown in FIG. 1, a cell distribution 101 of state "1" and a cell distribution of state "0" are shown in the current domain as well as in the time domain.

FIG. 2 shows an example of time-domain sensing of a complement cell comprising one true cell and one complementary cell. A cell distribution 201 according to the one shown in FIG. 1 is indicated. If the complement cell carries valid data (indicated in a scenario 202), the data is determined when the state of the cell which is programmed to zero (either true or complement) is identified. This may be the case at a decision time 204 after detection of the zero. In an erased or blank state the comparison works accordingly, but in this case both cells are assigned to the zero cell state. The sensing operation just detects the faster cell and assigns the slower cell a state "1", although the slower cell may also be in a blank state. Hence, it is not possible to determine whether the complement cell is in the blank state or contains valid data via the criterion decision after having read the first "0" at a time 205.

Hence, the solution presented may in particular conduct a comparison with other complement cells after a first "0" is detected. The other complement cells may be adjacent cells of the same memory device, in particular memory area, e.g., complement cells of the same page or sector of a non-volatile memory. It will thus be a strong indication for a blank state of the memory area, if two subsequent "0" values in one complement cell have already been detected on a predetermined number of other complement cells.

Figure 3:
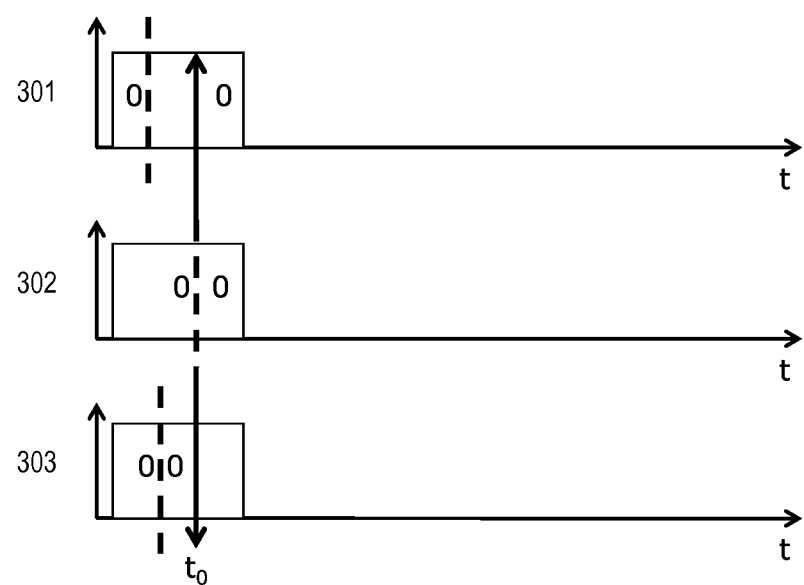
FIG. 3 shows a schematic diagram comprising three complement cells of a same memory device, all being in a blank state.

FIG. 3 shows a time diagram comprising three complement cells 301, 302 and 303 of a same memory device, all being in a blank state. The complement cells 301 to 303 may be subject to a common erase procedure. Hence, if they are erased or if they were never programmed before, all of them may be in the blank state. On the other hand, if the memory device was programmed before, each of the complement cells 301 to 303 carry valid data, i.e. logic "0" or "1", indicated by both of the respective true and complementary cells.

At a time $t_0$ a first "0" value has been read from the complement cell 301 and the two zeroes (true cell and complement cell) from the complement cell 303 have been read. Hence, when the first "0" value is read at this time $t_0$ from the complement cell 302, a further decision may be made that this complement cell 302 (and the other complement cells 301 and 303 as well) is (are) in a blank state. In other words, at the time $t_0$ when reading the first "0" value from the complement cell 302, two "0" values have already been read from at least one other complement cell 303 in the vicinity (or in the same memory area) of the complement cell 302. Having read two "0" values at least once may thus be a criterion for deciding that the memory area is in a blank state. However, it may be an option to decide that the memory area is in a blank state, if two "0" values were read from more than one other complement cells. The other complement cells may be adjacent complement cells or they may be complement cells of the same memory area. It may be an option to determine that the memory area is in the blank state in a case where two "0" values are read from a predetermined number of (adjacent) complement cells.

Figure 4:
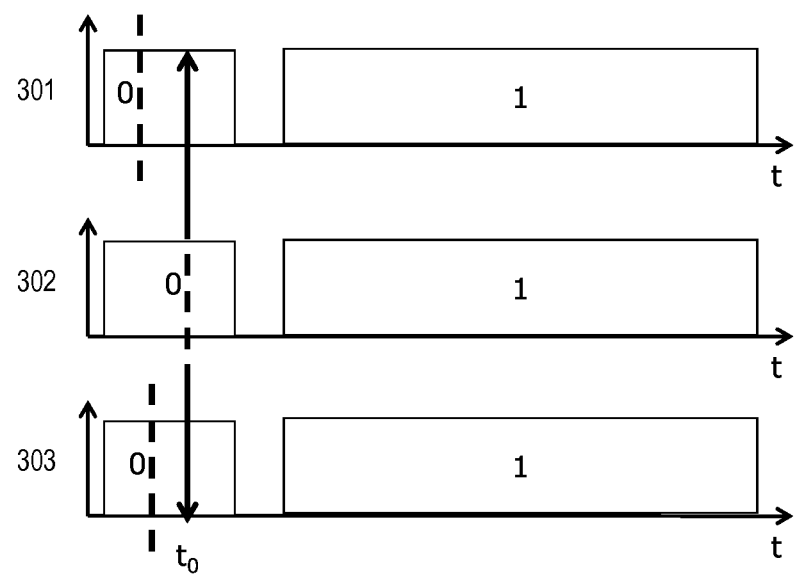
FIG. 4 shows complement cells being in a complement mode, i.e., not in the blank state.

FIG. 4 shows the complement cells 301 to 303 being in the complement mode, i.e. not in the blank state. In this example, at the time $t_0$ only a single "0" value is read from the complement cells 301 and 303. Hence, when the first "0" value is read at this time $t_0$ for the complement cell 302, a decision may be made that this complement cell 302 (and the other complement cells 301 and 303 as well) is (are) in the complement mode carrying (valid) complement data. In other words, for the complement cells being in the complement mode two successive "0" values are only possible in an error case scenario.

Hence, the time $t_0$ may be predefined for both scenarios shown in FIG. 3 and FIG. 4. At (or after) this time $t_0$, a decision can be made whether the complement cells 301 to 303 are in the blank state (in case at least one of the complement cells read show two "0" values) or in the complement mode carrying valid data (in case no successive "0" values were determined for the complement cells).

Figure 5:
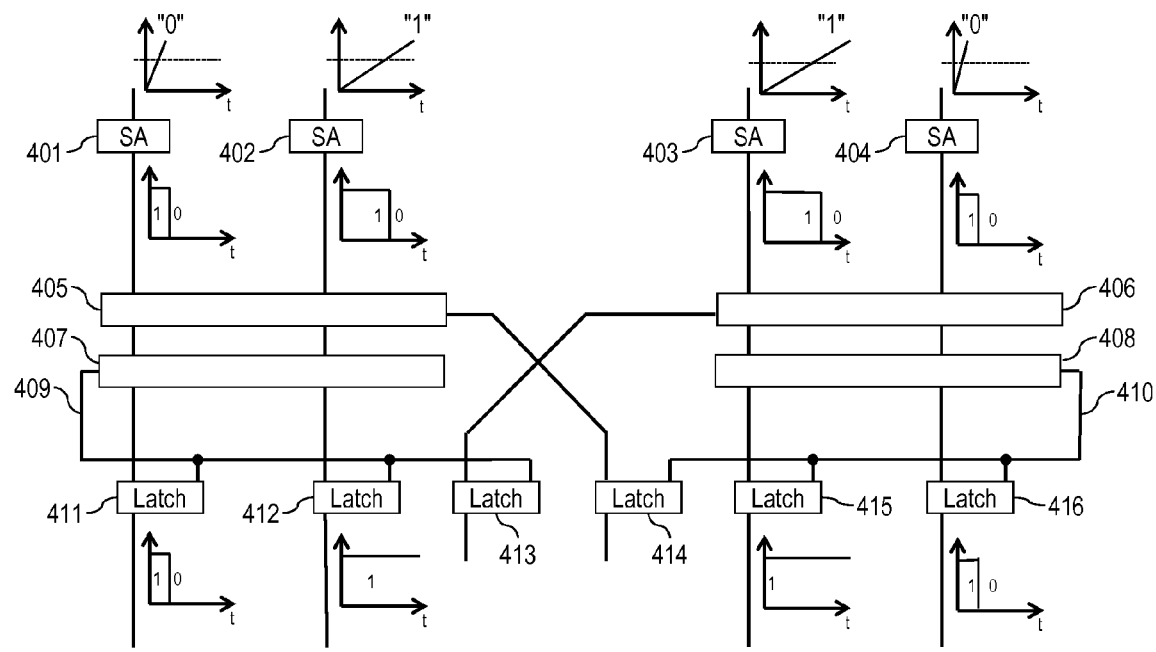
FIG. 5 shows an implementation of the example explained above. It allows checking for double "0" values in complement cells at predefined moments of time, e.g., when the first "0" value is detected.

FIG. 5 shows an implementation of the example explained above. It allows checking for double "0" values in complement cells at predefined moments of time, e.g., when the first "0" value is detected.

FIG. 5 shows several latches 411 to 416. Each of the latches 411 to 416 may have an input EN (enable input) and an input D (data input). When the input EN is set to "0", the output of the respective latch remains unchanged regardless of its input D, the latch is in a so-called frozen state. If the input EN is set to "1", the output of the latch corresponds to its input D, it is operated in a so-called "transparent" mode.

A logic "0" signal of a first memory cell is fed to a sense amplifier 401 and a logic "1" signal of a second memory cell is fed to a sense amplifier 402. The first and second memory cells are part of a complement cell as described above. The outputs of the sense amplifiers 401 and 402 are fed to a logic 405 that detects whether both outputs indicate a "0" value. In such case, the latch 414 is set by the logic 405.

The outputs of the sense amplifiers 401 and 402 are further connected to a logic 407, the output of the sense amplifier 401 is also stored in the latch 411 and the output of the sense amplifier 402 is also stored in the latch 412.

The logic 407 is triggered by the first "0" value determined during a read access that is directed to the first and second memory cell. When the first "0" value is detected, a hold signal 409 is supplied by the logic 407. The hold signal 409 "freezes" the states of the latches 411, 412 and 413.

Accordingly, a logic "1" signal of a third memory cell is fed to a sense amplifier 403 and a logic "0" signal of a fourth memory cell is fed to a sense amplifier 404. The third and fourth memory cells may be part of a complement cell as described above. The outputs of the sense amplifiers 403 and 404 are fed to a logic 406 that detects whether both outputs indicate a "0" value. In such case, the latch 413 is set by the logic 406.

The outputs of the sense amplifiers 403 and 404 are further connected to a logic 408, the output of the sense amplifier 403 is also stored in the latch 415 and the output of the sense amplifier 404 is also stored in the latch 416.

The logic 408 is triggered by the first "0" value determined during a read access that is directed to the third and fourth memory cell. When the first "0" value is detected, a hold signal 410 is supplied by the logic 408. The hold signal 410 "freezes" the states of the latches 414, 415 and 416.

The hold signal 409 is connected to the input EN of the latches 411 to 413, the hold signal 410 is connected to the input EN of the latches 414 to 416. The input D of the latch 411 is connected to the output of the sense amplifier 401, the input D of the latch 412 is connected to the output of the sense amplifier 402, the input D of the latch 415 is connected to the output of the sense amplifier 403 and the input D of the latch 416 is connected to the output of the sense amplifier 404. The input D of the latch 413 is connected to the output of the logic 406, which supplies a logic "1" signal in case two "0" values were read from the third memory cell and the fourth memory cell. The input D of the latch 414 is connected to the output of the logic 405, which supplies a logic "1" signal in case two "0" values were read from the first memory cell and the second memory cell.

Hence, according to the example shown in FIG. 5, after the first "0" value is read from the first memory cell, the value "0" is stored in the latch 411 and the value "1" of the second memory cell is stored in the latch 412. Also, the first "0" value is read from the fourth memory cell and stored in the latch 416. The value "1" of the third memory cell is stored in the latch 415. The first "0" value from the first memory cell triggers the hold signal 409, which freezes the states of the latches 411 to 413 and the first "0" value from the fourth memory cell triggers the hold signal 410, which freezes the states of the latches 414 to 416. The output of the latch 413 indicates whether or not two "0" values were detected by the logic 406 and the output of the latch 414 indicates whether or not two "0" values were detected by the logic 405.

Thus, a decision whether or not the complement cell comprising the first cell and the second cell is in a blank state can be made dependent on the output of the latch 414, i.e., whether or not an (e.g., adjacent) complement cell comprising the third cell and the fourth cell is in a blank state indicated by "0" values in both of the third cell and the fourth cell. The same applies vice versa, i.e., a decision whether or not the complement cell comprising the third cell and the fourth cell is in a blank state can be made dependent on the output of the latch 413, i.e., whether or not the (e.g., adjacent) complement cell comprising the first cell and the second cell is in a blank state indicated by "0" values in both of the first cell and the second cell.

In the example shown in FIG. 5, there are no two "0" values in both cells of a complement cell (i.e., neither the first and the second cell nor in the third and fourth cell). Hence, neither the latch 413 nor the latch 414 indicates two "0" values of the (adjacent) complement cell.

The example depicted in FIG. 5 allows making a decision whether or not a blank state is detected based on a single (adjacent) complement cell. It is noted, however, that such decision could be based on more than one (adjacent) complement cells, in particular on several complement cells of the same memory area, e.g., memory sector or memory page. The decision may hence be a majority decision or it may be based on at least a single complement cell indicating two "0" values.

Figure 6:
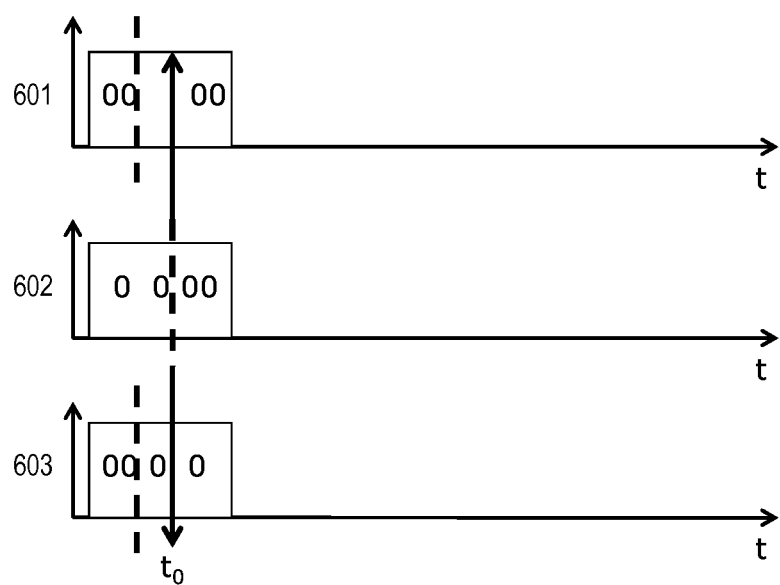
FIG. 6 shows an additional embodiment for a blank detection in case a complement cell comprises four cells, i.e. two true cells and two complementary cells.

FIG. 6 shows an additional embodiment for a blank detection in case a complement cell comprises four cell, i.e., two true cells and two complementary cells. This approach can also be regarded as "2+2 coding", i.e., having two cells of each type to represent a valid data bit. Each complement cell is thus represented by a quadruple of memory cells.

FIG. 6 shows an example of three complement cells 601, 602 and 603 of the same memory device, all being in a blank state. The complement cells 601 to 603 may be subject to a common erase procedure. Hence, if they are erased or if they were never programmed before, all of them are in the blank state. On the other hand, if the memory device was programmed before, each of the complement cells 601 to 603 carry valid data, i.e. logic "0" or "1", indicated by two true cells and two complementary cells.

At a time $t_0$ two "0" values has been read from the complement cell 601 and three "0" values have been read from the complement cell 603. Hence, when two "0" values are read at this time $t_0$ from the complement cell 602, a decision may be made that this complement cell 602 (and the other complement cells 601 and 603 as well) is (are) in a blank state. In other words, detecting at least three "0" values in at least one other complement cell may be a strong indication for a blank state of the memory area comprising the complement cells 601 to 603.

FURTHER EMBODIMENTS AND ADVANTAGES

The solution presented in particular increases the reliability to decide whether a memory area (e.g., memory page or memory sector) is in a blank state by comparing complement cells, wherein each complement cell may comprise at least one true cell and at least one complementary cell. At least one comparison with at least one additional complement cell may be conducted in order to determine whether the actual complement cell (and at least one additional complement cell) is (are) in the blank state. The blank state may be a consequence of a previous erase operation or it may be a status of a memory area that has not been programmed before.

Advantageously, the at least one complement cell that is subject to comparison may be an adjacent or neighboring complement cell.

A single data bit can be encoded by the complement cell, wherein the complement cell may comprise at least one true cell and at least one complementary cell. In particular, the number of true cells and the number of complementary cells for encoding a single bit may be equal.

It is also an advantage that the solution allows for a differential approach that may be largely insensitive to distribution shifts.

In addition, the solution presented may be applicable for all kinds of complement memories.

The examples suggested herein may in particular be based on at least one of the following solutions. In particular combinations of the following features could be utilized in order to reach a desired result. The features of the method could be combined with any feature(s) of the device, apparatus or system or vice versa.

A method for data processing is suggested, comprising transforming electrical variables for each cell of a data bit of a memory into a time domain, and determining a predetermined state by comparing the transformed electrical variables of at least two data bits.

It is noted that the predetermined state can be a blank state. As an alternative, the predetermined state may be a full programmed state.

The predetermined state may in particular be determined based on whether the states of the cells stem from a single (cell) distribution of from more than one (in particular two) (cell) distributions.

A memory area may comprise several data bits, wherein each of the data bits may be represented by a complement cell. The complement cell comprises at least one true (memory) cell and at least one complementary (memory) cell. For example, the complement cell may comprise a pair of cells with one true cell and one complementary cell. It is also an option that the complement cell comprises several pairs of cells. The cells are advantageously arranged on the same piece of memory.

The data bit may comprise two differential memory cells and the electrical variable may be a current or a voltage of the memory cell or associated with the memory cell. For example, a current of a true memory cell and a current of a complement memory cell may be determined as electrical variables. The respective current or a voltage derived from said current is transformed into the time domain, e.g., via integration. Hence, a time (or duration) may indicate the amount of the electrical variable, i.e., current or voltage.

The predetermined state (e.g., blank state) can be determined for a single data bit (comprising at least two complementary memory cells) or for a larger number of data bits (e.g., a page or sector) of a (differential read) memory.

The at least one other bit may be at least one adjacent or neighboring complement cell.

Hence, by checking other memory cells (data bits) on the same memory device, it may be derived whether the other data bits and/or the actual data bit is/are in, e.g., a blank state.

In an embodiment, the predetermined state is a blank state.

In an embodiment, the predetermined state is determined based on whether states of the cell stem from a single cell distribution or from two cell distributions.

In an embodiment, the data bits are part of the same portion of memory.

The data bits may be part of a non-volatile memory, in particular part of a sector or a page of a memory. It is noted that the data bits may be part of a portion of memory that is (in total) subject to an erase procedure.

In an embodiment, the method further comprises determining the predetermined state for the memory by comparing occurrences of state indicators within the transformed electrical variables of at least two data bits.

In an embodiment, the state indicator is assigned to a first predefined value or a second predefined value obtained during a read operation.

The comparisons may lead to a racing condition in the time domain. For example, the comparison between the true cell and the complementary cell may be conducted in a way that the first logic "0" as exemplary state indicator wins the race. Based on detecting this state indicator, latches for the true cell and the complementary cell may be locked. Also, an additional latch may be locked which would indicate whether or not two subsequent "0" values (i.e., two state indicators) occurred in an adjacent complement cell (i.e., data bit). If so, the two state indicators may be a strong indication that the data bits are in the predetermined state, e.g., a blank state. Otherwise, there may not (yet) be such indication of the predetermined state, e.g., the blank state.

In an embodiment, the method further comprises determining the predetermined state for a first data bit in case at least two state indicators have been detected in at least one second data bit prior to one state indicator being detected in the first data bit.

The state indicator may be any value read from a cell, be it the true cell or the complementary cell, that opens up the possibility that the data bit (e.g., the complement cell comprising the true cell and the complementary cell) may be in the predetermined state. Hence, a single state indicator may not suffice to determine whether or not the current data bit (complement cell) is in the predetermined state.

In an embodiment, the method further comprises determining the predetermined state for the data bits of the memory in case at least two state indicators have been detected in at least one second data bit prior to one state indicator being detected in the first data bit.

In an embodiment, the method further comprises determining that a first data bit is not in the predetermined state in case at least two state indicators have not been detected in at least one second data bit prior to one state indicator being detected in the first data bit.

In an embodiment, each data bit is represented by a group of at least two memory cells, wherein at least two memory cells of this group are complementary cells of a differential read memory.

In an embodiment, the memory cell is a memory cell of a non-volatile memory.

In an embodiment, the differential read memory comprises at least one of the following: floating gate cells, PCRAM, RRAM, MRAM, MONOS devices, nano crystal cells, and ROM.

A device is suggested, the device comprising a differential read memory, wherein each data bit is represented by a group of at least two memory cells, and wherein the at least two memory cells of this group are a true cell and a complementary cell. The device further comprises a conversion stage configured to transform electrical variables for each cell of a data bit into a time domain, and a processing unit configured to determine a predetermined state by comparing the transformed electrical variables of at least two data bits.

In an embodiment, the processing unit comprises, for each data bit, a first logic unit configured to determine whether the cells of the data bit show several state indicators, and a second logic unit configured to detect the first state indicator among the cells of the data bit.

In an embodiment, the first logic unit is configured to supply the information that several state indicators were detected to at least one other data bit.

The information that several state indicators were detected may in particular be supplied to a processing unit operable for the at least one other data bit. It is noted that this information may be used for several other data bits.

In an embodiment, the second logic unit is configured to lock the status of the cells of the data bit and lock a status whether at least other data bit has yet detected several state indicators.

In an embodiment, the processing unit is configured to determine the predetermined state for a first data bit in case at least two state indicators have been detected in at least one second data bit prior to one state indicator being detected in the first data bit.

In an embodiment, the processing unit is configured to determine the predetermined state for the data bits of the memory in case at least two state indicators have been detected in at least one second data bit prior to one state indicator being detected in the first data bit.

In an embodiment, the processing unit is configured to determine that a first data bit is not in the predetermined state in case at least two state indicators have not been detected in at least one second data bit prior to one state indicator being detected in the first data bit.

In an embodiment, the memory cell is a memory cell of a non-volatile memory.

In an embodiment, the differential read memory comprises at least one of the following: floating gate cells, PCRAM, RRAM, MRAM, MONOS devices, nano crystal cells, and ROM.

A device for data processing is suggested for determining a predetermined state of at least one data bit. The device comprises means for transforming electrical variables for each cell of a data bit of a memory into a time domain, and means for determining a predetermined state by comparing the transformed electrical variables of at least two data bits.

A computer program product is provided, being directly loadable into a memory of a digital processing device, comprising software code portions for performing the steps of the method as described herein.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various exemplary embodiments of the disclosure have been disclosed, it will be apparent to those skilled in the art that various changes and modifications can be made which will achieve some of the advantages of the disclosure without departing from the spirit and scope of the disclosure. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the disclosure may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method for data processing in a differential read memory device, wherein each data bit thereof is represented by a group of at least two memory cells, and wherein the at least two memory cells of this group are a true cell and a complementary cell, comprising:
   transforming an electrical variable for each memory cell of a data bit of the differential read memory device into a time domain using a conversion stage; and
   determining whether or not a predetermined state exists by comparing the transformed electrical variable of at least two data bits using a processing unit.

2. The method according to claim 1, wherein the predetermined state is a blank state.

3. The method according to claim 1, wherein the predetermined state is determined based on whether states of the cell stem from a single cell distribution or from two cell distributions.

4. The method according to claim 1, wherein the data bits are part of the same portion of memory.

5. The method according to claim 1, further comprising determining whether or not the predetermined state exists for the memory by comparing occurrences of state indicators within the transformed electrical variables of at least two data bits.

6. The method according to claim 5, wherein the state indicator is assigned to a first predefined value or a second predefined value obtained during a read operation.

7. The method according to claim 5, further comprising determining that the predetermined state exists for a first data bit when at least two state indicators have been detected in at least one second data bit prior to one state indicator being detected in the first data bit.

8. The method according to claim 5, further comprising determining that the predetermined state exists for the data bits of the memory when at least two state indicators have been detected in at least one second data bit prior to one state indicator being detected in the first data bit.

9. The method according to claim 5, further comprising determining that a first data bit is not in the predetermined state when at least two state indicators have not been detected in at least one second data bit prior to one state indicator being detected in the first data bit.

10. The method according to claim 1, wherein the memory cell is a memory cell of a non-volatile memory.

11. The method according to claim 1, wherein the differential read memory comprises at least one of the following:
    floating gate cells;
    PCRAM,
    RRAM,
    MRAM,
    MONOS devices,
    nano crystal cells, and
    ROM.

12. A device, comprising:
    a differential read memory, wherein each data bit is represented by a group of at least two memory cells, and wherein the at least two memory cells of this group are a true cell and a complementary cell;
    a conversion stage configured to transform an electrical variable for each cell of a data bit into a time domain; and
    a processing unit configured to determine a predetermined state by comparing the transformed electrical variable of at least two data bits.

13. The device according to claim 12, the processing unit comprising for each data bit:
    a first logic unit configured to determine whether the cells of the data bit show several state indicators; and
    a second logic unit configured to detect the first state indicator among the cells of the data bit.

14. The device according to claim 13, wherein the first logic unit is configured to supply the information that several state indicators were detected to at least one other data bit.

15. The device according to claim 13, wherein the second logic unit is configured to lock the status of the cells of the data bit and for locking a status whether at least other data bit has yet detected several state indicators.

16. The device according to claim 12, wherein the predetermined state for a first data bit is determined by the processing unit when at least two state indicators have been detected in at least one second data bit prior to one state indicator being detected in the first data bit.

17. The device according to claim 12, wherein the predetermined state for the data bits of the memory is determined by the processing unit when at least two state indicators have been detected in at least one second data bit prior to one state indicator being detected in the first data bit.

18. The device according to claim 12, wherein another state not comprising the predetermined state of a first data bit is determined by the processing unit when at least two state indicators have not been detected in at least one second data bit prior to one state indicator being detected in the first data bit.

19. The device according to claim 12, wherein the memory cell is a memory cell of a non-volatile memory.

20. The device according to claim 12, wherein the differential read memory comprises at least one of the following:
    floating gate cells;
    PCRAM,
    RRAM,
    MRAM,
    MONOS devices,
    nano crystal cells, and
    ROM.

21. A device for data processing for determining a predetermined state of at least one data bit in a differential read memory device, wherein each data bit thereof is represented by a group of at least two memory cells, and wherein the at least two memory cells of this group are a true cell and a complementary cell, comprising:
    means for transforming an electrical variable for each memory cell of a data bit of a memory into a time domain; and
    means for determining a predetermined state of the differential read memory device by comparing the transformed electrical variable of at least two data bits thereof.

22. A computer program product having instructions stored on a non-transitory storage medium directly loadable into a memory of a digital processing device, comprising software code portions for performing the method according to claim 1.

* * * * *